United States Patent

Myer

[11] Patent Number: 5,619,168
[45] Date of Patent: Apr. 8, 1997

[54] DISTORTION CREATION AND REDUCTION CIRCUIT

[75] Inventor: Robert E. Myer, Denville, N.J.

[73] Assignee: Lucent Technologies Inc., Murray Hill, N.J.

[21] Appl. No.: 512,002

[22] Filed: Aug. 7, 1995

[51] Int. Cl.$^6$ .................................................. H03F 1/26
[52] U.S. Cl. ................................................ 330/149; 330/151
[58] Field of Search .............................. 330/52, 149, 151

[56] References Cited

U.S. PATENT DOCUMENTS

| | | | |
|---|---|---|---|
| 4,580,105 | 4/1986 | Myer | 330/149 |
| 4,595,882 | 6/1986 | Silagi et al. | 330/151 |
| 4,879,519 | 11/1989 | Myer | 330/149 |
| 5,117,197 | 5/1992 | Hsu et al. | 330/149 |
| 5,412,342 | 5/1995 | Sakamoto et al. | 330/149 |
| 5,455,538 | 10/1995 | Kobayashi et al. | 330/149 |

Primary Examiner—Steven Mottola

[57] ABSTRACT

The present invention in one embodiment provides a distortion creation and reduction circuit comprising a distortion circuit, a correction circuit, and a final signal combiner. The distortion circuit receives a first carrier signal and forms a first distorted carrier signal comprised of a first carrier signal and a first distortion signal component. The correction circuit receives a second carrier signal and forms a second distorted carrier signal comprised of a second carrier signal and a second distortion signal component. The first and second distorted carrier signals are formed and combined so that the first and second distortion signal components destructively combine and the first and second carrier signal components constructively combine. The distortion circuit is preferably comprised of a power amplifier. The correction circuit preferably comprises a distortion correction portion, a carrier correction portion, a correction signal combiner, and a correction amplifier.

24 Claims, 2 Drawing Sheets

5,619,168

DISTORTION CREATION AND REDUCTION CIRCUIT

FIELD OF THE INVENTION

The present invention relates to the field of the distortion reduction circuitry and more particularly to the field of distortion reduction circuitry designed for use with power amplifiers.

BACKGROUND OF THE INVENTION

Electrical circuitry, such as power amplifiers, often add undesired distortion to an input signal, creating an output signal comprised of a distortion component and an input signal component. R. E. Myer, U.S. Pat. No. 4,580,105, issued Apr. 1, 1986, discloses a prior art technique in FIG. 1, for reducing the distortion component created by a power amplifier 14. This technique involves taking a portion of the output signal and combining it with an input signal which has been adjusted in phase and amplitude. This signal combination, isolates the distortion component of the output signal. The isolated distortion component is adjusted in phase and gain, and then added back to the output signal at a coupler 10, to eliminate the distortion component and obtain the desired input signal component. One of the disadvantages of the prior art technique disclosed in Myer, U.S. Pat. No. 4,580,105, is that a significant amount of power of the output signal is lost when the isolated distortion component signal is added in at the coupler 10. This loss of power can be offset by increasing the size of the power amplifier 14, however that is expensive.

R. E. Myer, U.S. Pat. No. 4,879,519, issued Nov. 7, 1989, discloses another technique for reducing distortion produced by a power amplifier. In that patent, a pre-distortion signal from a combiner 115 is applied to the inputs of amplifiers 135-1 through 135-N. The pre-distortion signal is opposite in phase and is designed to cancel the distortion component that is subsequently introduced by the amplifiers 135-1 through 135-N. (FIG. 1, col. 3, ln. 55-col. 4, ln. 8)

SUMMARY OF THE INVENTION

Some embodiments of the present invention provide a distortion creation and reduction circuit comprising a distortion circuit, a correction circuit, and a final signal combined. The distortion circuit receives a first carrier signal and adds a first distortion signal to form a first distorted carrier signal. The correction circuit receives a second carrier signal and adds a second distortion signal to form a second distorted carrier signal. The first and second distorted carrier signals are combined by the final signal combiner. The first and second distorted carrier signals are formed and combined so that the first and second distortion signals destructively combine and the first and second carrier signals constructively combine.

The distortion circuit is preferably comprised of a power amplifier. The correction circuit preferably comprises a distortion correction portion, a carrier correction portion, a correction signal combiner, and a correction amplifier. The distortion correction portion provides a second distortion signal for cancelling the first distortion signal created by the power amplifier. The distortion correction portion is preferably coupled to the distortion circuit by a splitter which takes a portion of the first distorted carrier signal from the output of the power amplifier. The distortion correction portion also comprises a signal combiner for combining the portion of the first distorted carrier signal with the second carrier signal, phase and gain adjustment stage comprised of a phase adjustment circuit and a gain adjustment circuit.

The carrier correction portion of the correction circuit provides a second carrier signal for adding to the first carrier signal from the power amplifier. The carrier correction portion comprises a splitter for taking a portion of the second carrier signal, and a phase and gain adjustment stage comprised of a phase adjustment circuit and a gain adjustment circuit.

Some embodiments of the present invention eliminates the loss occurring in previous distortion creation and reduction circuits when an out of phase distortion signal was added to a distorted carrier signal to eliminate distortion.

DETAILED DESCRIPTION OF THE DRAWINGS

Figure 1:
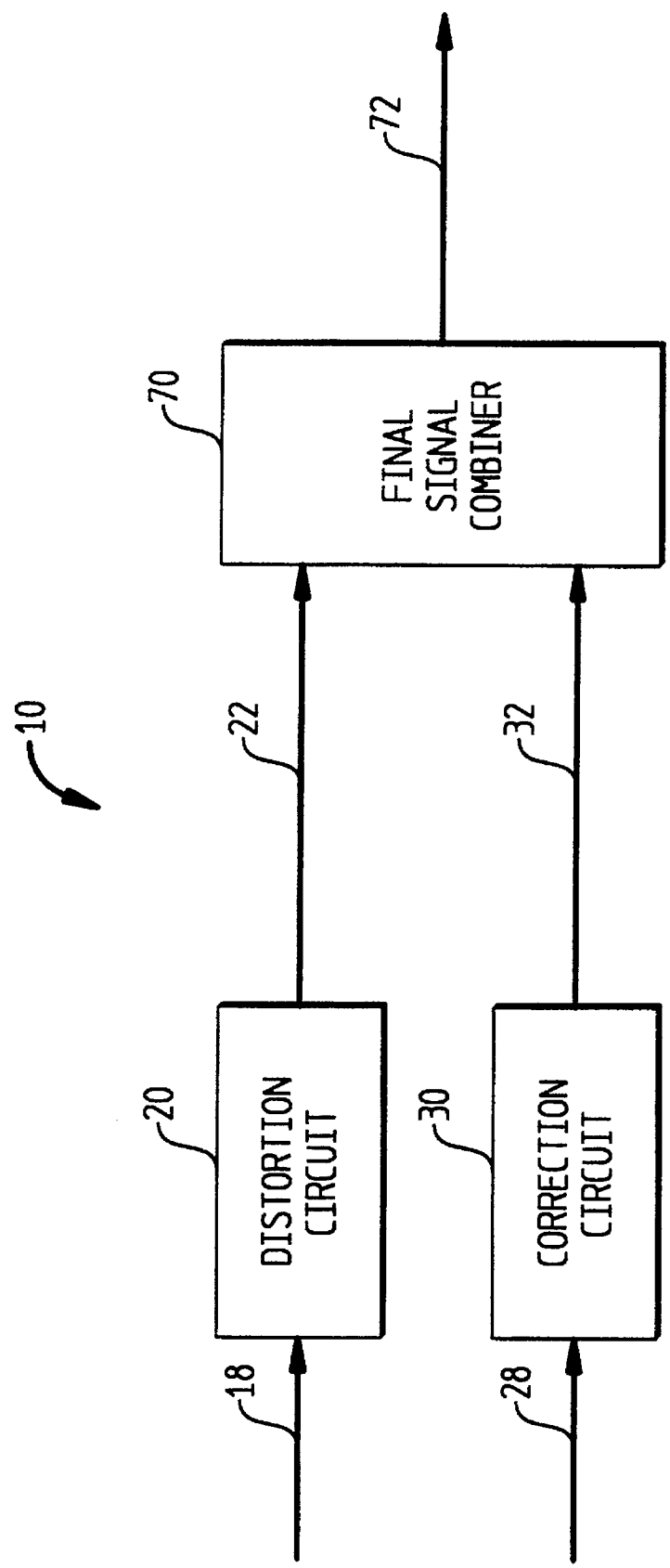
FIG. 1 illustrates a block diagram of a distortion creation and reduction circuit in accordance with an embodiment of the present invention.

FIG. 1 shows a block diagram of a distortion creation and reduction circuit 10 which provides a distortion reduction and carrier addition technique in accordance with an embodiment of the present invention. Distortion creation and reduction circuit 10 typically includes a distortion circuit 20, a correction circuit 30, and a final signal combiner 70.

In operation, a first carrier signal is inserted at input 18 of the distortion circuit 20 and a second carrier signal is inserted at input 28 of the correction circuit 30. Preferably, the two carrier signals have the same frequency. The distortion circuit 20 adds a first distortion signal to the first carrier signal to form a first distorted carrier signal at its output 22. The correction circuit 30 adds a second distortion signal to the second carrier signal to form a second distorted carrier signal at its output 32. The first and second distorted carrier signals are combined by final signal combiner 70 and the combination is produced at output 72.

The first and second distorted carrier signals are preferably formed and combined so that the first and second distortion signal components are substantially out of phase with one another and when combined cancel each other, and the first and second carrier signal components are substantially in-phase with each other, and when combined reinforce each other.

Figure 2:
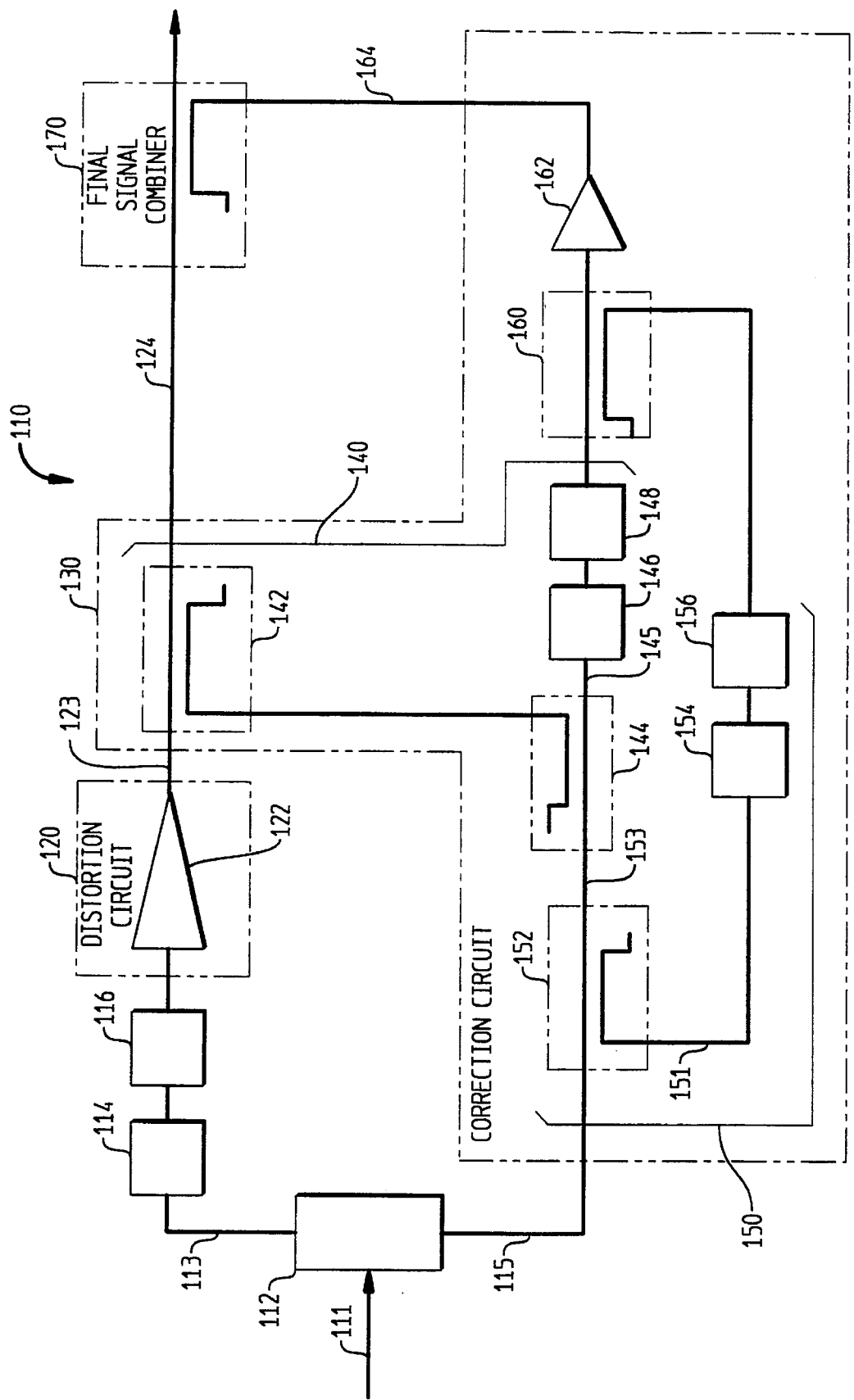
FIG. 2 is a detailed schematic of a distortion creation and reduction circuit.

FIG. 2 shows a detailed embodiment of a circuit 110 in accordance with an exemplary embodiment present invention. The circuit 110 includes a distortion circuit 120, a correction circuit 130, and a final signal combiner 170 corresponding to the similarly numbered components in FIG. 1. FIG. 2 further shows an input splitter 112, which typically splits an original carrier signal into a first and second carrier signal, and phase and gain adjustment circuits 114 and 116. The original carrier signal may be split in various ways known in the art.

The distortion circuit 120 preferably comprises a main amplifier 122. The correction circuit 130 typically comprises a distortion correction portion 140, a carrier correction portion 150, a correction signal combiner 160, and a correction amplifier 162. The distortion correction portion 140 preferably includes a splitter 142, a combiner 144, a phase adjustment circuit 146, and a gain adjustment circuit 148. The carrier correction portion 150 preferably includes a splitter 152, a phase adjustment circuit 154, and a gain adjustment circuit 156.

In operation, an original carrier signal is fed to the input 111 of the splitter 112. The splitter 112 splits the original carrier signal into a first carrier signal and a second carrier signal. A split into two signals of equal amplitude is preferred, although the other ways of splitting the original carrier signal are contemplated.

The first carrier signal is sent via output 113 to phase and gain adjustment circuits 114 and 116, and subsequently to distortion circuit 120, while the second carrier signal is sent via output 115 to correction circuit 130. The phase and gain adjustment circuits 114 and 116 are adjusted to cancel the original carrier signal at the input 145 to phase adjustment circuit 146. The first and second carrier signals preferably have the same frequency.

The first carrier signal is modified in phase and in amplitude by phase and gain adjustment circuits 114 and 116 and then amplified by main amplifier 122 of distortion circuit 120. The main amplifier 122 of the distortion circuit 120 adds an undesirable first distortion signal to the first carrier signal to create a first distorted carrier signal at its output 123.

A portion of the first distorted carrier signal at output 123 is coupled through splitter 142 into the distortion correction portion 140 of the correction circuit 130. Preferably splitter 142 is a 20 DB directional coupler. This means that 1% of the power of the first distorted carrier signal is taken by the distortion correction portion 140, while the other 99% of the power of the first distorted signal continues along the main output line 124. Typically, there is also a resistor loss of 0.1% of the power in the splitter 142, however that is negligible.

The part of the first distorted carrier signal obtained by the distortion correction portion 140 of the correction circuit 130, is combined with part of the second carrier signal by use of the signal combiner 144. The signal combiner 144 may typically be a 20 DB coupler, although its value will depend on the total loss introduced by both the signal combiner 144 and the splitter 142 and the gain of the main amplifier 122. The output 145 of signal combiner 144 is modified in phase and amplitude by phase and gain adjustment circuits 146 and 148, respectively. The phase and gain adjustment circuits 146 and 148 are adjusted by an automatic control circuit such as the automatic control circuit 16 disclosed in the application titled "DIRECTION SENSOR AND DISTORTION REDUCTION CONTROL CIRCUITRY" by R. E. Myer, filed concurrently with the present application and which is incorporated herein by reference, to cancel distortion at the output of the final signal combiner 170. Preferably, the phase and gain are adjusted so that the second distortion signal component from the correction circuit 130, will cancel the first distortion signal component, from the distortion circuit 120.

The carrier correction portion 150 of the correction circuit 130 receives part of the second carrier signal from splitter 152. Splitter 152 is preferably a 10 DB directional coupler, meaning that the carrier correction portion 150 takes 10% of the power of the second carrier signal along line 151, while 90% of the power of the second carrier signal continues along line 153. Again, there is a resistor loss in the coupler but that is negligible. The signal obtained by the carrier correction portion 150 is modified in phase and gain by phase and gain adjustment circuits 154 and 156 respectively.

The phase and gain adjustment circuits 154 and 156 are preferably fixed at one time at a factory so that the maximum carrier power output can be obtained. Preferably the phase and gain are adjusted so that the second carrier signal component will add in phase with the first carrier signal component when the first and second distorted carrier signals are combined at the final signal combiner 170.

The signal from the carrier correction portion 150 and from the distortion correction portion 140 are combined together in correction signal combiner 160, whose output is applied to the correction amplifier 162. The final correction signal on output 164 is added to the remaining portion of the first distorted carrier signal on output 124, by the final signal combiner 170. Preferably, the final signal combiner is a 10 DB directional coupler, meaning that 90% of the remaining first distorted carrier signal is combined with 10% of the second distorted carrier signal. The first and second distorted carrier signals are formed and combined so that the first and second distortion signal components are out of phase and destructively combine, and the first and second carrier signal components are in phase and constructively combine. Instead of a 0.5 DB loss in carrier signal power in prior art systems, the present technique introduces a 0.5 DB gain for an overall gain of 1 DB over prior art systems.

The main amplifier 120 may be 10 times the size of the correction amplifier 162. For example the main amplifier 120 may be 100 watts and the correction amplifier 162 may be 10 watts. Other means of signal combining, splitting, or coupling may be used besides directional couplers as known in the art.

I claim:

1. A distortion creation and reduction circuit comprising:

a distortion circuit having an input and an output, which receives a first carrier signal at its input and adds a first distortion signal to form a first distorted carrier signal comprised of a first carrier signal component and a first distortion signal component at its output, a correction circuit having an input and an output, which receives a second carrier signal at its input and adds a second distortion signal to form a second distorted carrier signal comprised of a second carrier signal component and a second distortion signal component at its output, and a final signal combiner having two inputs and an output, which combines the first and the second distorted carrier signals, wherein the first and second distorted carrier signals are formed and combined so that the first and second distortion signal components destructively combine and the first and second carrier signal components constructively combine.

2. The distortion creation and reduction circuit of claim 1 wherein the first and second carrier signals are substantially comprised of the same frequencies.

3. The distortion creation and reduction circuit of claim 1 wherein the final signal combiner is a directional coupler.

4. The distortion creation and reduction circuit of claim 3 wherein the final signal combiner is comprised of a directional coupler which combines about 90% of the first distorted carrier signal with about 10% of the second distorted carrier signal.

5. The distortion creation and reduction circuit of claim 1 wherein the distortion circuit is comprised of a main power amplifier.

6. The distortion creation and reduction circuit of claim 1 further comprising:

a phase and gain adjustment stage comprised of a phase adjustment circuit and a gain adjustment circuit, the stage having an input and an output, the output connected to the input of the distortion circuit, the gain and phase adjustment stage receiving a first carrier signal and adjusting the gain and phase of the first carrier signal.

7. The distortion creation and reduction circuit of claim 1 wherein the correction circuit comprises:

a carrier correction portion, having an input and an output, the input receiving a first portion of the second carrier signal, a distortion correction portion, having a first input, a second input, and one output, the first input receiving a second portion of the second carrier signal, the second input receiving a first portion of the first distorted carrier signal, and the output adaptable for combining the second portion of the second carrier signal with the first portion of the first distorted carrier signal to produce the second distortion signal, and a correction signal combiner for combining the output from the carrier correction portion with the distortion correction portion.

8. The distortion creation and reduction circuit of claim 7 wherein the correction circuit further comprises a correction amplifier, having an input and an output, whose input is connected to the correction signal combiner and whose output is connected to the final signal combiner.

9. The distortion creation and reduction circuit of claim 8 wherein the carrier correction portion comprises:

a splitter, and a phase and gain adjustment stage comprised of a phase adjustment circuit and a gain adjustment circuit.

10. The distortion creation and reduction circuit of claim 9 wherein the distortion correction portion comprises:

a splitter, a signal combiner, and a a phase and gain adjustment stage comprised a phase adjustment circuit and a gain adjustment circuit.

11. A correction circuit for reducing distortion having an input and an output and comprising:

a carrier correction portion, having an input and an output, the input receiving a first portion of a second carrier signal, a distortion correction portion, having a first input, a second input, and one output, the first input receiving a second portion of the second carrier signal, the second input receiving a first portion of a first distorted carrier signal which is comprised of a first carrier signal component and a first distortion signal component, the output of the distortion correction portion adaptable for combining the second portion of the second carrier signal with the first portion of the first distorted carrier signal to produce a second distortion signal, a correction signal combiner for combining the output from the carrier correction portion with the distortion correction portion to form a second distorted carrier signal comprised of a second carrier signal component and a second distortion signal component, and a a final signal combiner having two inputs and an output, the first input connected to the output of the correction signal combiner, the second input adapted to receive the first distorted carrier signal, the output of the final signal combiner adaptable to add the first distorted carrier signal and the second distorted carrier signal so that the first and second distortion signal components destructively combine and the first and second carrier signal components constructively combine.

12. The correction circuit of claim 11 wherein the correction circuit further comprises a correction amplifier, having an input and an output, whose input is connected to the correction signal combiner and whose output is connected to the final signal combiner.

13. The correction circuit of claim 12 wherein the carrier correction portion comprises a splitter, and a gain and phase adjustment stage comprised of a phase adjustment circuit and a gain adjustment circuit.

14. The correction circuit of claim 13 wherein the distortion correction portion comprises:

a splitter, a signal combiner, and a a gain and phase adjustment stage comprised of a gain adjustment circuit and a phase adjustment circuit.

15. A method for reducing distortion in a first distorted carrier signal comprised of a first carrier signal component and a first distortion signal component comprising the steps of:

forming a second distorted carrier signal comprised of a second carrier signal component and a second distortion signal component, and combining the first and second distorted carrier signals so that the first and second carrier signals constructively combine and the first and second distortion signals destructively combine.

16. The method of claim 15 wherein the first and second carrier signals are substantially comprised of the same frequencies.

17. The method of claim 16 wherein the first and second distorted carrier signals are combined using a directional coupler.

18. The method of claim 17 wherein about 90% of the first distorted carrier signal is combined with about 10% of the second distorted carrier signal.

19. The method of claim 16 wherein the:

the second distorted carrier signal is formed by the steps of:

adjusting the gain and phase of the second carrier signal, adjusting the gain and phase of the second distortion signal, combining the second carrier signal and the second distortion signal and amplifying the combination to form the second distorted carrier signal.

20. The method of claim 19 wherein the second carrier signal is a substantial duplicate of the first carrier signal and is derived from a splitter, and the second distortion signal is derived by combining a portion of the first distorted carrier signal with a portion of the second carrier signal which has been inverted in phase.

21. A distortion creation and reduction circuit comprising:

means for providing a first distorted carrier signal comprised of a first carrier signal component and a first distortion signal component, means for providing a second distorted carrier signal comprised of a second carrier signal component and a second distortion signal component, means for combining the first and second distorted carrier signals so that the first and second distortion signal components destructively combine and the first and second carrier signal components constructively combine.

22. The distortion creation and reduction circuit of claim 21 wherein the first and second carrier signal components are substantially comprised of the same frequencies.

23. A correction circuit for correcting a first distorted carrier signal comprised of a first carrier signal component and a first distortion signal component comprising:

means for providing a second carrier signal component to reinforce the first carrier signal component; and means for providing a second distortion signal component to reduce the first distortion signal component, wherein the second carrier signal component and the second distortion signal component are applied at the same location in the correction circuit to the first distorted carrier signal.

24. The correction circuit of claim 23 wherein:

the means for providing the second carrier signal component to reinforce the first carrier signal component provides the second carrier signal component in a form which is consistently and substantially in phase with the first carrier signal component; and the means for providing the second distortion signal component to reduce the first distortion signal component provides the second distortion signal component in a form which is consistently and substantially out of phase with the first distortion signal component.

* * * * *